(12) United States Patent
Maeda et al.

(10) Patent No.: US 6,352,943 B2
(45) Date of Patent: *Mar. 5, 2002

(54) METHOD OF FILM FORMATION AND METHOD FOR MANUFACTURING SEMICONDUCTOR DEVICE

(75) Inventors: Kazuo Maeda, Kanagawa; Yuhko Nishimoto, Tokyo, both of (JP)

(73) Assignee: Semiconductor Process Laboratory Co., Ltd. (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/157,936

(22) Filed: Sep. 22, 1998

(30) Foreign Application Priority Data

May 20, 1998 (JP) .......................................... 10-138040

(51) Int. Cl.$^7$ ............................................. H01L 21/31
(52) U.S. Cl. ....................... 438/778; 438/781; 438/787; 438/789
(58) Field of Search ......................... 438/778, 780–781, 438/787–790, 624, 632, 700–703

(56) References Cited

U.S. PATENT DOCUMENTS

| | | | | |
|---|---|---|---|---|
| 5,502,006 A | * | 3/1996 | Kasagi | 438/624 |
| 5,518,962 A | * | 5/1996 | Murao | 438/624 |
| 5,716,890 A | * | 2/1998 | Yao | 438/624 |

FOREIGN PATENT DOCUMENTS

| | | | | |
|---|---|---|---|---|
| EP | 0680084 | * | 2/1995 | ......... H01L/21/768 |
| JP | 1248528 | | 10/1989 | |
| JP | 222475 | | 1/1990 | |
| JP | 737879 | | 1/1990 | |
| JP | 5-47758 | | 2/1993 | |
| JP | 6-69192 | | 3/1994 | |
| JP | 6-163723 | | 6/1994 | |
| JP | 7-221090 | | 8/1995 | |
| JP | 8-8336 | | 1/1996 | |

OTHER PUBLICATIONS

Levin, R. M. water absorption and densification of phosphosilicate glass films, 1982.*
Kern W : "Densification of vapor–deposited phosphosilicate glass films" RCA REVIEW,, Mar. 1976, USA vol. 37, No. 1 pp. 55–57.
Law K et al: Plasma–Enhanced Deposition of Borohosphosilicate Glass Using TEOS and Silane Sources Solid State Technology, US Cowan Publ. Corp. Washington vol. 32 No. 4, (Apr. 1, 1989), pp. 60–62.
Fujino K et al: "Reaction mechanism of TEOS and 0/sub3/ atmosphereic pressure CVD" 1991 Proceedings. Eight International IEEE VLSI Multilevel Interconnection Conference (Cat. No. 91TH0359–0), Santa Clara, CA, USA, Jun. 11–12, 1991, pp. 445–447.
Shuichi Mayumi et al: PSG Flow in High–Pressure Steam Japanese Journal of Applies Physics, JP, Publication Office Japanese Journal of Applied Physics. Tokyo, vol. 29, No. 4, Apr. 1, 1990, pp. 645–649.

* cited by examiner

Primary Examiner—Charles Bowers
Assistant Examiner—Thanh Nguyen
(74) Attorney, Agent, or Firm—Lorusso & Loud

(57) ABSTRACT

This invention relates to a method of film formation in which, when a silicon oxide film (a NSG film: a Non-doped Silicate Glass) is formed on a substrate having a recess by a CVD method using a mixed gas containing TEOS and ozone, surface dependency on the substrate is eliminated to embed a silicon oxide film into the recess of the surface. The invention includes forming a phosphorus containing insulating film as a base layer on the surface of a substrate and forming a silicon-containing insulating film on the phosphosilicate glass film by the chemical vapor deposition method, using a mixture of a ozone-containing gas and a silicon-containing gas.

22 Claims, 7 Drawing Sheets

22 Trench Groove (recess)

21 Semiconductor Substrate 24a    25 Recess
       24b Wiring
23
21

THE CORRELATION BETWEEN THE SURFACE DEPENDENCY OF A DEPOSITION RATE OF THE O₃ / TEOS SiO₂ FILM AND AN ANGLE OF CONTACT

Hydrophilic ⟷ Hydrophobic

Substrate Layer : PSG (AD).NSG < Th. SiO₂ ≪ BPSG Si < PSG (EX)

Angle of Contact (θ) : 0 - 9°  40°  45° - 60°  60° - 70°

Substrate Layer : PSG (AD) < Th. SiO₂ ≪ PSG (EX) < BPSG < NSG < Si

Ratio of Deposition Rates : 0.67  0.74  0.88  0.92  0.94  1.00
(5% O₃ in O₂)

Type of Substrate Layer (TEOS System)

- - -●- - -   NSG   4% AD
- - -▲- - -   NSG   0.6% AD
——○——   PSG   2 mol % EX
——▫——   PSG   4~6 mol %EX
——□——   PSG   10 mol % EX
——●——   BPSG  8-8 mol % EX
——■——   PSG   8 mol % AD

METHOD OF FILM FORMATION AND METHOD FOR MANUFACTURING SEMICONDUCTOR DEVICE

BACKGROUND OF THE INVENTION

1. Field of the Invention

This invention relates to a method of film formation and a method for manufacturing a semiconductor device in which, when a silicon oxide film (a NSG film: a Non-doped Silicate Glass) is formed on a substrate having a recess by a CVD method using a mixed gas containing TEOS and ozone, surface dependency of the substrate is eliminated, whereby a silicon oxide film flows into the recess of the surface.

The surface dependency is defined as a property of a surface such that film formation depends on the property of the surface on which the film is deposited.

2. Description of the Prior Art

In recent years, micronizing has been advanced for semiconductor devices. Recesses narrow in width and deeper in depth such as the recess between wirings and the recess in which an insulating material is embedded for an insulating element separation, are designed to be formed on a semiconductor substrate surface. In such semiconductor devices, an insulating film is required to become embedded in the recess.

Therefore, a silicon oxide film excellent in film quality (hereinafter referred to as a High $O_3$/TEOS $SiO_2$ film) is required to be formed and to become embedded in the recess without leaving a clearance. A CVD method is used as a method of the film formation. Mixed gas containing both the TEOS (Tetraethylorthosilicate) and the ozone-containing gas containing a high concentration of $O_3$ is used as a deposition gas, said ozone-containing gas containing 1% or more $O_3$ in $O_2$.

However, since the High $O_3$/TEOS $SiO_2$ film is sensitive to a property of the surface of the substrate, the depositing film tends to be influenced by that surface property. The influence of the surface dependency appears as a reduction in the film formation rate, as surface roughness of the depositing film and as a reduction in film quality. Therefore, in order to deposit the High $O_3$/TEOS $SiO_2$ film on a silicon substrate with the same film formation rate, surface condition of the depositing film and film quality of the depositing film, it is required for the surface of the substrate be such that the film formation of the High $O_3$/TEOS $SiO_2$ film not be influenced by surface dependency. Heretofore, in order to eliminate such surface dependency, the following countermeasures are have been taken:

① The silicon oxide film is formed as a base layer on the surface of the substrate by a plasma enhanced CVD. This is disclosed in Japanese Laid-open Patent Publication No. Hei. 7-211712.

② The surface of the substrate is exposed to plasma gases. This is disclosed in Japanese Laid-open Patent Publication No. Hei. 4-94539.

③ The silicon oxide film hereinafter referred to as a Low $O_3$/TEOS $SiO_2$ film) is formed as a base layer on the surface of the substrate by the CVD method. As the film formation gas, the reaction gas containing the ozone-containing gas containing low concentration $O_3$ whose the concentration of $O_3$ in $O_2$ is less than 1% and TEOS is used. This is disclosed in Japanese Laid-open Patent Publication No. Hei. 3-198340.

Furthermore, the following method combining the methods described above has been used.

④ Low $O_3$/TEOS $SiO_2$ film is formed as the base layer on the surface of the substrate by the CVD method and subsequently, the Low $O_3$/TEOS $SiO_2$ film is exposed to plasma gases. A reaction gas containing both the TEOS and a low ozone-containing gas such that the concentration of $O_3$ in $O_2$ is as low as less than 1% is used as the film formation gas for the Low $O_3$/TEOS $SiO_2$ film.

⑤ The High $O_3$/TEOS $SiO_2$ film is formed as the base layer on the surface of the substrate by the CVD method and subsequently, the High $O_3$/TEOS $SiO_2$ film is exposed to plasma gases. A reaction gas containing both the TEOS and a high ozone-containing gas such that the concentration of $O_3$ in $O_2$ is as high as not less than 1% is used as the film formation gas for the High $O_3$/TEOS $SiO_2$ film.

Additional methods for eliminating the surface dependency of the substrate are disclosed in Japanese Laid-open Patent Publication No. Hei. 7-66131.

By adoption of such methods, the $O_3$/TEOS $SiO_2$ depositing film is not influenced by surface dependency of the substrate and has sufficient fluidity.

PROBLEMS TO BE SOLVED BY THE INVENTION

However, in the methods for eliminating the surface dependency described above, there are the following problems:

That is, in the method forming the silicon oxide film as the base layer on the surface of the substrate by the CVD method described as ① above, since the silicon oxide film formed by the plasma enhanced CVD method is poor in step coverage, it is not suitable for embedding a recess narrow in width and deeper in depth.

Moreover, in the method described as ② above, involving exposing the surface of the substrate to plasma gases, since a plasma apparatus is required, the apparatus becomes expensive. Moreover, in such method, there are other problems that lead to an increase in cost and it is a question whether or not reform can be performed to the bottom of a recess narrow in width and deeper in depth by the plasma.

Furthermore, in the method described as ③, the thickness of the Low $O_3$/TEOS $SiO_2$ film is required at least 50 nm or more. It is not suitable for embedding a recess narrow in width and deeper in depth.

Moreover, with regard to the item ④ and the item ⑤ also, there are the same problems as associated with the item ② and the item ③.

SUMMARY OF THE INVENTION

It is the object of this invention to provide a method of film formation and a method for manufacturing a semiconductor device capable of reliably eliminating the surface dependency of the substrate, to form an insulating film having excellent film quality.

The object of this invention is to provide a method of film formation and a method for manufacturing a semiconductor device capable of embedding the insulating film, without clearance, in a recess of the substrate, wherein the recess is narrow in width and deeper in depth.

As described above, in this invention, a phosphorus-containing insulating film such as a phosphosilicate glass film is formed as a base layer on the surface of the substrate. Furthermore, on the phosphorus-containing insulating film, a silicon-containing insulating film is formed by a chemical vapor film formation using the mixed gas containing the ozone-containing gas and a silicon-containing gas.

According to experiments by the inventor, in the case of depositing the silicon-containing insulating film by a chemical vapor deposition method using the mixed gas containing the ozone containing gas and a silicon-containing gas on the substrate, the surface dependency of the substrate can be eliminated by precoating the surface of the substrate with a phosphorus-containing insulating film such as a phosphosilicate glass film (a PSG film) or a borophosphosilicate glass film (BPSG film).

Incidentally, it has been stated that, when the High $O_3$/TEOS $SiO_2$ film is formed by the chemical vapor deposition method using the ozone-containing gas and a silicon-containing gas containing high concentration ozone (defined as a concentration of ozone in oxygen of 1% or more), the surface dependency of the deposition film on the substrate is remarkably apparent. According to the invention, since the surface dependency can be eliminated by precoating the surface of the substrate with a phosphorus-containing insulating film, sufficient fluidity can be obtained, even when the High $O_3$/TEOS $SiO_2$ film is readily influenced by the surface dependency is deposited.

Moreover, the surface dependency can be sufficiently eliminated by a phosphorus-containing insulating film with a thin film thickness of approximate 10 nm. Therefore, even the inside of a narrow recess of, at least approximately 20 nm or more in width can be coated. Moreover, the upper limit of the film thickness of the phosphorus-containing insulating film is influenced by the width of the recess. At this point of time, the film thickness of the phosphorus-containing insulating film is defined preferably such that the film thickness of the phosphorus-containing insulating film becomes sufficiently thin as compared with the silicon-containing insulating film, in an interlayer dielectric film constituted by the phosphorus containing insulating film as the base layer and the silicon containing insulating film which lies thereon. Usually, a phosphorus-containing insulating film having a thickness of approximately 100 nm is acceptable.

Therefore, when there is a recess narrow in width and deeper in depth on the surface of the substrate, the recess can be embedded with the silicon oxide film without clearance, and without generating voids and seams on the silicon oxide film formed in the recess.

In this case, the ozone-containing gas, the silicon-containing gas and the phosphorus-containing gas are discharged by a first gas discharge means to form the phosphorus-containing insulating film and then the ozone-containing gas and the silicon-containing gas are discharged by a second gas discharge means continuously, after ceasing the discharge by the first discharge means, to form the silicon oxide film. Incidentally, it has been found by experiment that, in order to eliminate the dependency on the surface of the phosphorus-containing insulating film, when subsequently forming the silicon-containing insulating film on the phosphorus-containing insulating film, it is required that there be no phosphorus-containing gas in the reaction gas. That is when the silicon-containing insulating film is formed using a gas discharge means which differs from the gas discharge means where forming the phosphorus-containing insulating film, the surface dependency at the surface of the phosphorus-containing insulating film can be eliminated. A deposition chamber for the phosphorus-containing insulating film may be replaced with a deposition chamber for the silicon-containing insulating film or the alternate gas discharge means may be switched respectively upon forming also.

Moreover, the following fact has been verified by experiment. After the process of forming the phosphorus-containing insulating film and before the process of forming the silicon-containing insulating film on the phosphorus-containing insulating film, the surface of the phosphorus-containing insulating film is exposed to the atmosphere, or the surface of the phosphorus-containing insulating film is exposed to water vapor while heating the surface of the phosphorus-containing insulating film, the surface of the phosphorus-containing insulating film is converted to hydrophobic, and when the surface of the phosphorus-containing insulating film is converted to hydrophobic, the surface dependency in the above-described film deposition is suppressed. Especially, when the High $O_3$/TEOS $SiO_2$ film readily influenced by the surface dependency is deposited, such treatment is preferably performed.

Furthermore, the ozone-containing gas used in the film formation of the silicon-containing insulating film is the gas containing ozone of the concentration of less than 10% in oxygen.

As described above, to use the phosphorus-containing insulating film as the base layer is effective, in particular, when depositing the High $O_3$/TEOS $SiO_2$ film readily influenced by the surface dependency, using the high ozone-containing gas wherein the concentration of ozone in oxygen is as high as 1% or more.

As a matter of course, this is effective also when depositing the silicon oxide film (the Low $O_3$/TEOS $SiO_2$ film) not readily influenced by the surface dependency using the low ozone containing gas wherein the concentration of ozone in oxygen is as low as less than 1%.

The reason why is that, by the deposition, penetration of moisture and migration of alkali ions from the Low $O_3$/TEOS $SiO_2$ film to the substrate can be prevented.

In the case of depositing the silicon-containing insulating film by CVD method using the mixed gas of the $O_3$/TEOS, the flowability of the depositing film can be increased by regulating the deposition temperature within the range of 350° C. to 550° C. With regard to the deposition temperature, in order to obtain sufficient flowability of the depositing film, it is preferable that the deposition temperature be regulated within the range of 375° C. to 425° C.

DESCRIPTION OF THE PREFERRED EMBODIMENTS

Hereafter, the embodiments of the invention are described hereinafter with reference to the drawings.

(1) Basic Data of this Invention

This invention is based on knowledge gained regarding the parameters, used in the depositing reaction of the $O_3$/TEOS $SiO_2$ film in the case using a chemical vapor deposition method (a CVD method), described below as items (i) to (iv).

(i) The flowability during depositing the $O_3$/TEOS $SiO_2$ film is seen at a deposition temperature within the range of 375° C. to 425° C.

On the other hand, when the deposition temperature exceeds 450° C., the result is isotropic growth. At temperatures exceeding 500° C., the deposition of the silicon-containing insulating film by the CVD method used the mixed gas of $O_3$/TEOS (hereinafter represented as an $O_3$/TEOS) becomes a completely isotropic deposition.

Figure 7:
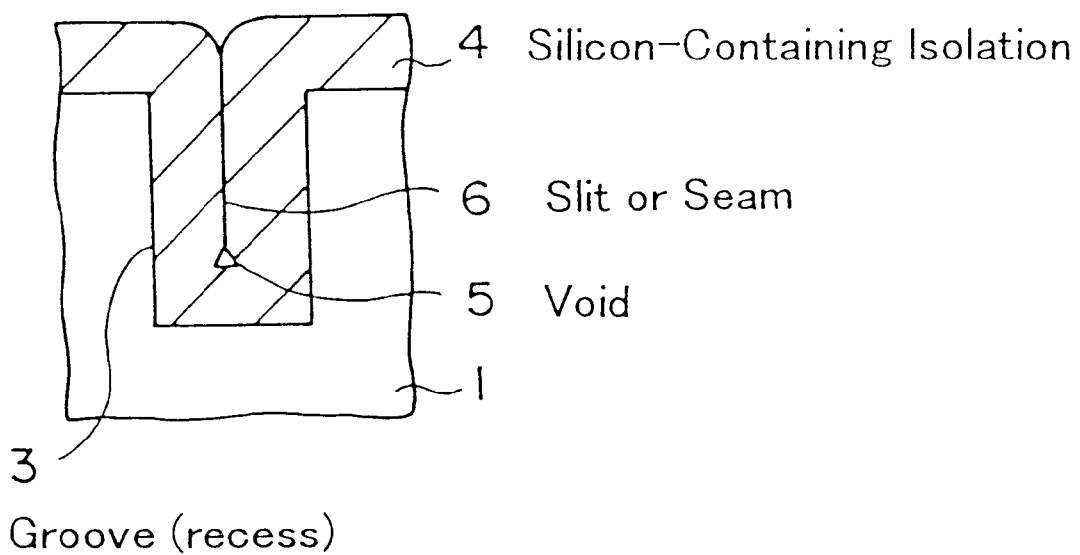
FIG. 7 is a sectional view showing cross-sectional shape of a silicon-containing insulating film formed on a substrate with the step and the groove by the method of film formation according to a comparison example.

In this case, the silicon-containing insulating film 4 is also capable of being formed in a narrow and deep recess 3 as shown in FIG. 7. However, a void 5 or slit 6 may occur if the silicon-containing insulating film 4 is thicker.

Figure 4:
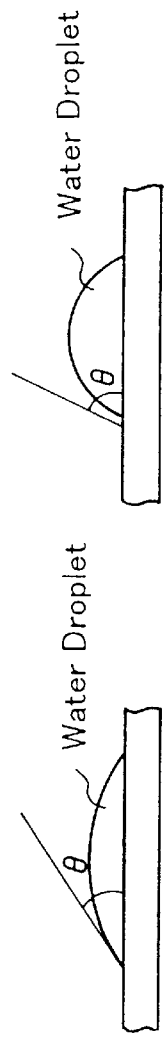
FIG. 4 is a view showing the correlation between the surface dependency of a deposition rate and an angle of contact of the $O_3$/TEOS NSG film being formed by the method of film formation according to embodiments of the invention.

(ii) FIG. 4 is a view showing the relationship among properties of the surface depending on whether the base layer surface is hydrophilic or hydrophobic, an angle of contact (θ) of water deposited on a base layer surface and the ratio of the deposition rates of various films being formed on the base layer.

As shown in FIG. 4, the angle of contact (θ) is the angle which the tangent to the drop of water at the contact surface with the base layer surface forms with the base layer surface, when water deposited on a base layer surface beads into droplets by surface tension. A ratio of the deposition rates refers to the ratio of the deposition rate where the same film is deposited on various base layers to the deposition rate where various films are formed on a silicon surface directly. It is shown that as the ratio of the film deposition rates approaches 1, the surface dependency is more suppressed.

Moreover, the term "Th.$SiO_2$" in FIG. 4 refers to the silicon oxide film formed by thermal oxidation. The term "AD" refers to "as deposited", that is, the meaning of "immediately after deposition". The term "EX" refers to "after exposure, that is, the meaning of "after exposing to the atmosphere".

In the comparison data of the ratio of the deposition rates, a high ozone-containing gas, wherein the concentration of ozone in oxygen is 5% is used as an oxidizing gas in the film formation of a phosphosilicate glass (PSG)(AD), an impurity-free silicon oxide film (NSG), a borophosphosilicate glass film (BPSG) and PSG (EX).

As shown in FIG. 4, the surface dependency of the $O_3$/TEOS $SiO_2$ film on the base layer depends upon the angle of contact (θ) of water deposited on the base layer surface, that is, whether the base layer surface is hydrophilic or hydrophobic.

When the surface of the base layer is hydrophilic, the surface dependency of the depositing film is high, and when the surface of the base layer is hydrophobic, the surface dependency of the depositing film is low. Moreover, in FIG. 4, the reason why even though the NSG is hydrophilic, the surface dependency of the depositing film on the base layer is low is unknown with the current state of the art.

Figure 5:
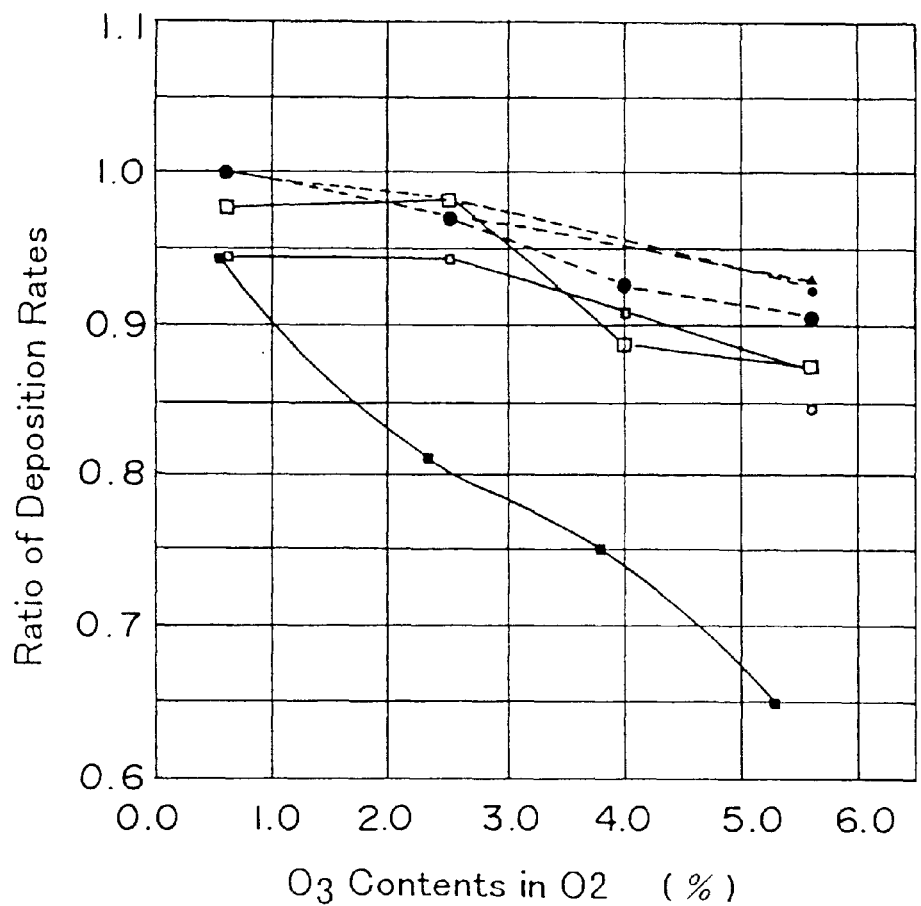
FIG. 5 is a graph obtained by investigation showing the correlation between the ratio of the deposition rates and an ozone concentration of the $O_3$/TEOS NSG film being formed by the method of film formation according to embodiments of the invention, for various types of base layers.

(iii) FIG. 5 is a graph showing the relationship between the ozone concentration in the ozone-containing gas used in film formation of the NSG film deposited on the base layer and the ratio of the deposition rates of the NSG film, for various types of base layers ("substrate layer").

The ratio of the deposition rates expressed in a linear scale is shown on the vertical axis and the concentration of ozone (%) in oxygen expressed in a linear scale is shown on the horizontal axis.

Moreover, in the table of the various films used as the base layers:

"NSG 4% AD" refers to a NSG film formed using an ozone-containing gas wherein the concentration of ozone in oxygen is less than 4%. In addition, it shows that immediately after deposition, an additional deposition is performed thereon.

"PSG 2 mol % EX" refers to a PSG film containing 2 mol % phosphorus which has been exposed to the atmosphere, before deposition thereon.

"PSG 4 to 6 mol % EX" refers to a PSG film containing 4 to 6 mol % phosphorus.

"BPSG 8 to 8 mol % AD" refers to a BPSG film containing 8 mol % born and 8 mol % phosphorus and deposition thereon immediately after its formation.

Other identifications of films conform to these described above formations. The concentration of ozone in the ozone-containing gas used in deposition of both the PSG film and the BPSG film was 4%.

As shown in FIG. 5, there is the significant correlation between the concentration of ozone in the ozone-containing gas used in deposition of the silicon-containing insulating film and the surface dependency.

Moreover, in the case that the base layer is PSG, immediately after deposition of the base layer (AD), the surface dependency on the base layer is high. However, it is understood that when the base layer is exposed to the atmosphere (EX), the surface of the base layer is converted from hydrophilic to hydrophobic, whereby the surface dependency of the depositing film becomes low.

The degree of the surface dependency according to the type of the base layer is shown in Table 1.

TABLE 1

| Surface dependency | Type depositing film | Type of base layer |
|---|---|---|
| High (DR < 0.7) | High $O_3$ NSG film | Th.$SiO_2$ HD PSG (AD) SOG |
| Low (0.7 < RD < 1.0) | High $O_3$ NSG film BSG film | BSG, PSG (EX) BPSG, P—SiO SiN P—SiO, Al, |

TABLE 1-continued

| Surface dependency | Type depositing film | Type of base layer |
| --- | --- | --- |
| No dependence | High $O_3$ NSG film | refractory metal polysilicon, silicon |
|  | PSG film, BPSG film | Every type of clean substrate |
|  | Low $O_3$ NSG film |  |

Note)
1. "High $O_3$ NSG film" refers to a High $O_3$/TEOS $SiO_2$ film.
2. "Low $O_3$ NSG film" refers to a Low $O_3$/TEOS $SiO_2$ film.
3. "HD PSG (AD)" refers to a PSG film which contains a high concentration phosphorus and deposition on the film is performed immediately after it is formed.
4. "PSG (EX)" refers to a posterior PSG film which was exposed to the atmosphere after deposition.
5. "P—SiO" refers to a silicon oxide film deposited from a plasma of a gas containing the TEOS.

Table 1 provides a comparison of the degrees of the surface dependencies where the Low $O_3$ NSG film (referred to the Low $O_3$/TEOS $SiO_2$ film) base layer, the High $O_3$ NSG film (refer to the High $O_3$/TEOS $SiO_2$ film), the BSG film, the PSG film or the BPSG film are formed on the various films as the base layer.

According to Table 1, the High $O_3$ NSG film is influenced strongly by the surface dependency on the base layer when being deposited on a $Th.SiO_2$, HDPSG (AD) film (a high concentration phosphorus-containing PSG film (AD)) or a SOG (Spin-On-Glass) film as the base layer. That is, the ratio of the deposition rates (DR) becomes less than 0.7.

On the other hand, the influence of surface dependency on the base layer is an intermediate degree, when the High $O_3$ NSG film is deposited on BPSG, BSG, PSG (EX), or P—SiO film as the base layer. That is, the ratio of the deposition rates (DR) becomes 0.7 or more and less than 1.

Moreover, in the case of depositing a P—SiO, it is not entirely influenced by dependency on the surface under that P—SiO film. Furthermore, on any type of surface, deposition of the PSG film and the BPSG film on the Low $O_3$ NSG film are not influenced by dependency on the surface under the PSG film and the BPSG film.

The "P—SiO film" is a silicon oxide film deposited from a plasma of a gas containing TEOS. The "SiN film" is a silicon nitride film.

Other films are identified in conformance with the above descriptions.

(iv) When the $O_3$/TEOS $SiO_2$ film is deposited on the base layer, a so-called barrier layer or a shield layer is required between the base layer and the $O_3$/TEOS $SiO_2$ film. The barrier layer or the shield layer is required for insulating the $O_3$/TEOS $SiO_2$ film and the base layer surface, for preventing moisture from transmitting and for eliminating the surface dependency of the depositing film on the base layer or the like. Moreover, the base layer surface being exposed to some types of materials is required to be uniform.

This invention is devised based on the findings described above, and hereinafter, embodiments of the invention are described.

(2) Embodiments of the Invention

Figure 1A:
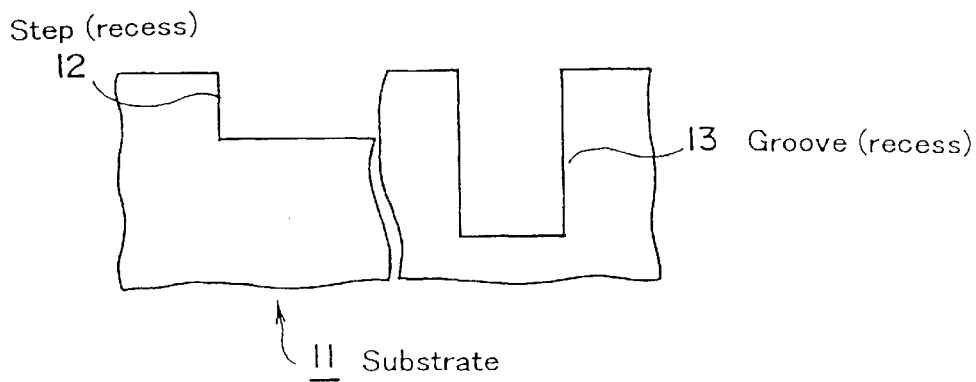
FIG. 1A to FIG. 1C are flowcharts of a method of film formation and a method for manufacturing a semiconductor device according to embodiments of the invention.
Figure 1B:
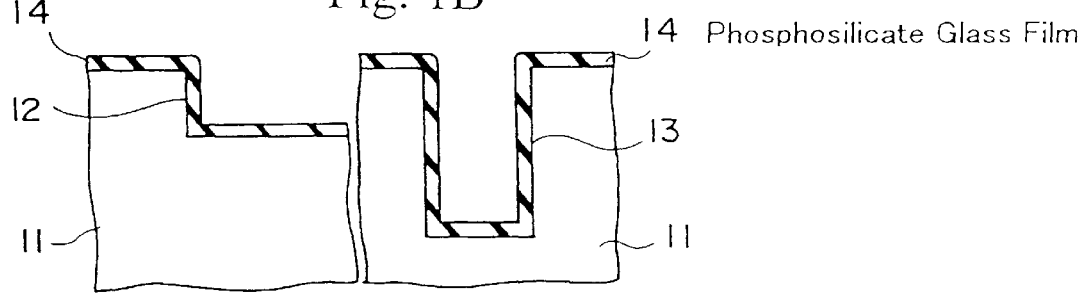
Figure 1C:
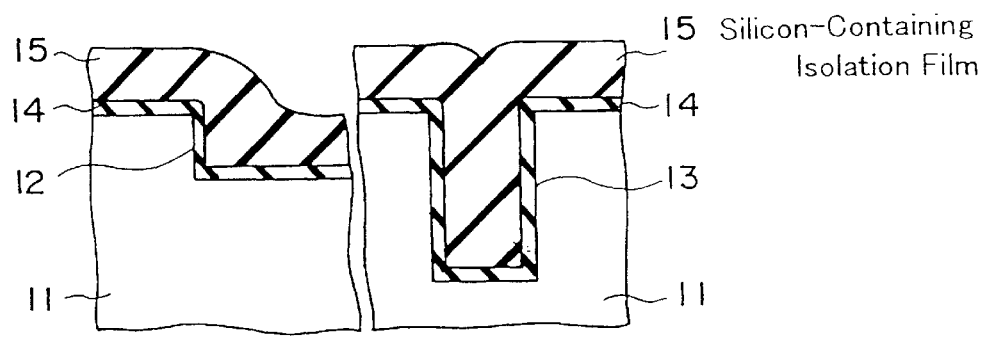
Figure 6:
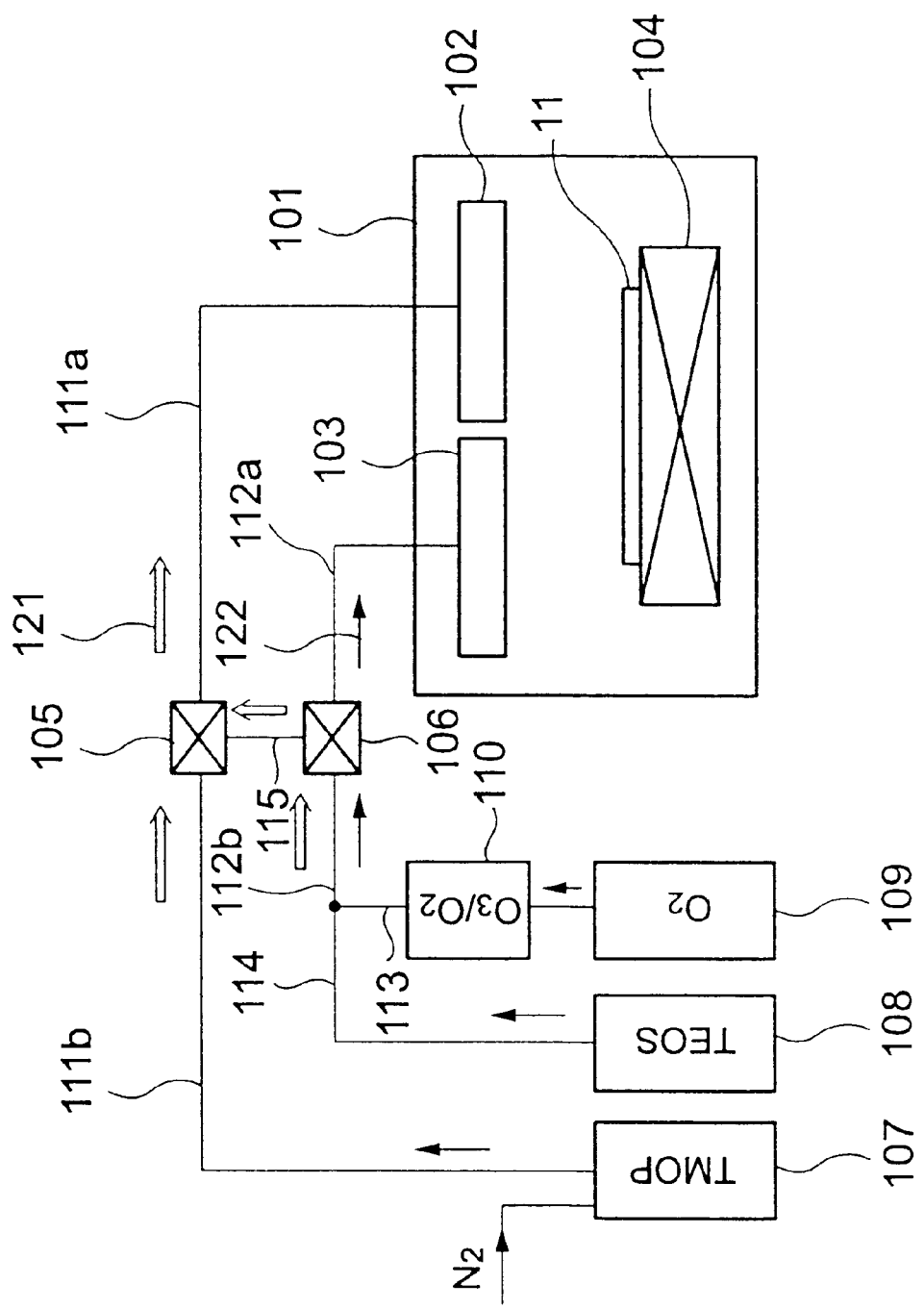
FIG. 6 is a side view of a deposition chamber applied to the method of film formation according to embodiments of the invention.

FIG. 1A to FIG. 1C are sectional views illustrating embodiments of the invention. FIG. 6 is a side view showing structure of the deposition chamber.

Figure 3A:
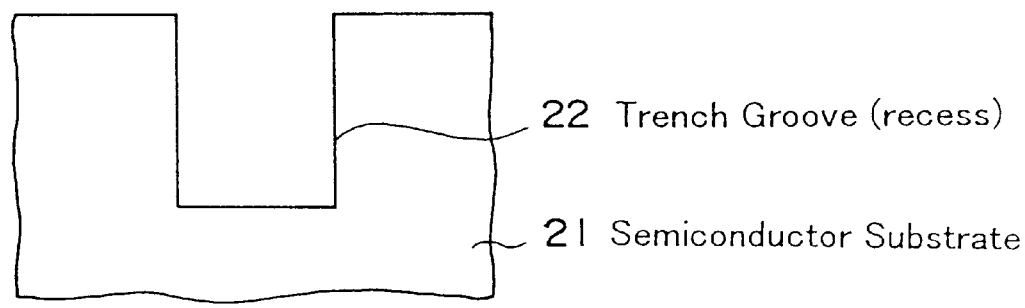
FIG. 3A is a sectional view showing a substrate with a step used in the method of film formation and the method for manufacturing the semiconductor device according to embodiments of the invention.
Figure 3B:
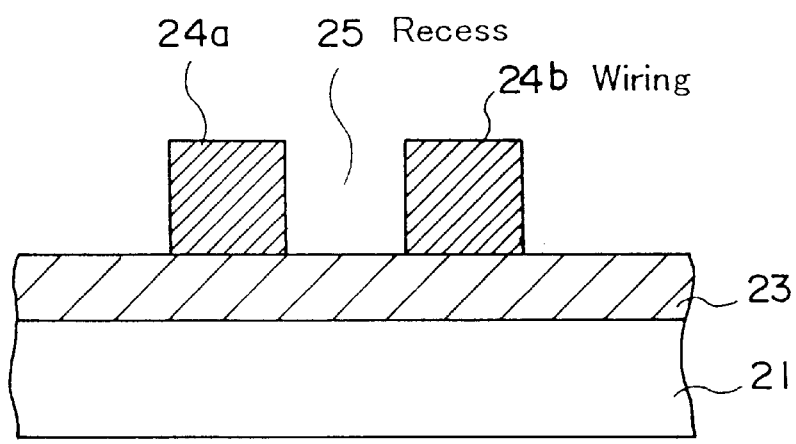
FIG. 3B is a sectional view showing a substrate with a trench groove used in the method of film formation and the method for manufacturing the semiconductor device according to embodiments of the invention.

First, a substrate 11 shown in FIG. 1A is placed on a table 104 in a deposition chamber 101. On the surface of the substrate 11, asperties are caused by a step (a recess) 12 and a groove (a recess) 13. For example, as shown in FIG. 3A and 3B, such asperties are the asperties being caused by a trench groove 22 formed on a surface of a semiconductor substrate 21 and wiring 24a and 24b formed on a base insulating layer 23.

Subsequently, the substrate 11 is heated to keep it within the temperature range of 350° C. to 550° C., preferably within 375° C. to 425° C. In this embodiment, for example, the temperature is 400° C.

Next, as shown in FIG. 1B, a thin phosphosilicate glass film (a phosphorus-containing insulating film) 14 is deposited on the surface of the substrate 11 (the base layer) by the CVD method. For this purpose, a gas conduit 112a supplying a gas discharge means 103 is closed and gas conduits 112b-115-111a, and 111b-111a are in communication through valves 105, 106. With valves 105 and 106 set in this manner, a reaction gas 121 consisting of the ozone-containing gas wherein the concentration of ozone in oxygen is 5%, a nitrogen gas containing the TEOS (a silicon-containing gas), and TMOP (Trimetylphosphate ($PO(OCH_3)_3$): a phosphorus-containing gas) are introduced through a first gas discharge means 102 onto the substrate 11. The ozone-containing gas is supplied from an $O_2$ source 109 and ozonizer 110, a nitrogen gas containing the TEOS is supplied from TEOS source 108, and TMOP is supplied from TMOP source 107.

The reaction gas reacts as the temperature of the substrate 11 is increased by heating to deposit a phosphor glass film 14 on the substrate 11.

At this point of time, the flow rate of the TMOP is adjusted in advance such that a phosphorus content in the phosphosilicate glass film 14 becomes less than 10%.

Moreover, the film thickness of the phosphosilicate glass film 14 is determined such that the film thickness becomes sufficient to eliminate the surface dependency and in consideration of the width and the depth of the step (the recess) 12 and the groove (the recess) 13. That is, the thickness sufficient to eliminate the surface dependency has been found to be approximate 10 nm or more by experiment.

Moreover, the film thickness of the phosphosilicate glass film 14 is influenced by the width of the recess, whereby it is preferable to be formed as thin as possible such that the groove (the recess) 13 is not is not filled with only the phosphosilicate glass film 14. In general, in an interlayer dielectric film constituted by the phosphosilicate glass film 14 as the base layer and a silicon oxide film 15 laying thereon, the film thickness of the phosphosilicate glass film 14 is preferably established so that the film thickness of the phosphosilicate glass film 14 becomes sufficiently thin as compared with the film thickness of the silicon oxide film 15. Usually, when the film thickness of the phosphosilicate glass film 14 is approximate 100 nm, it can be recognized to be sufficiently thin. In this embodiment, for example, a deposition time is established such that the film thickness of the phosphosilicate glass film 14 becomes 10 nm or more and less than 100 nm.

After a lapse of the deposition time established by the above description, the phosphosilicate glass film 14 within the range of 10 to 100 nm in thickness is formed on the substrate ii. Since the deposition temperature of the phosphosilicate glass film 14 is within the range of 375° C. to 425° C., the phosphosilicate glass film 14 is smooth and grows in an approximately isotropic condition regardless the type of material exposed to the substrate 11. Moreover, the surface dependency of the depositing film is eliminated by the phosphosilicate glass film 14.

Moreover, it is effective to perform the treatment by exposure to water vapor with heating at the same temperature as the deposition temperature in the deposition chamber, before forming the silicon oxide film (the silicon-containing insulating film) on the phosphosilicate glass film 14. Therefore, the surface on the phosphosilicate glass film 14 is converted from hydrophilic to hydrophobic.

Subsequently, the TMOP is stopped and the gas supply is switched to gas supply line 112b-111a from the gas supplying lines 112b-115-111a and 11b-111a through which the reaction gas 121 containing the TMOP was fed. Therefore, the ozone containing gas containing the same concentration ozone used to deposit the phosphosilicate glass film 14 and the TEOS (a silicon-containing gas) continuously flow into the same deposition chamber 101 through the second gas discharge means 103 onto the substrate 11. Moreover, the temperature of the substrate is also kept as is. That is, the temperature of the substrate is kept within the temperature range of 350° C. to 550° C., preferably within 375° C. to 425° C., in common with the deposition temperature of the phosphosilicate glass film.

As shown in FIG. 1C, while keeping this condition, the silicon-containing insulating film (the High $O_3$/TEOS $SiO_2$ film the silicon-containing insulating film) 15 is formed on the phosphosilicate glass film 14. At this point in time, since the surface dependency of the depositing film on the base layer has been eliminated, the High $O_3$/TEOS $SiO_2$ film 15 being deposited exhibits significant fluidity and flows into the recess 13 narrow in width.

Figure 2A:
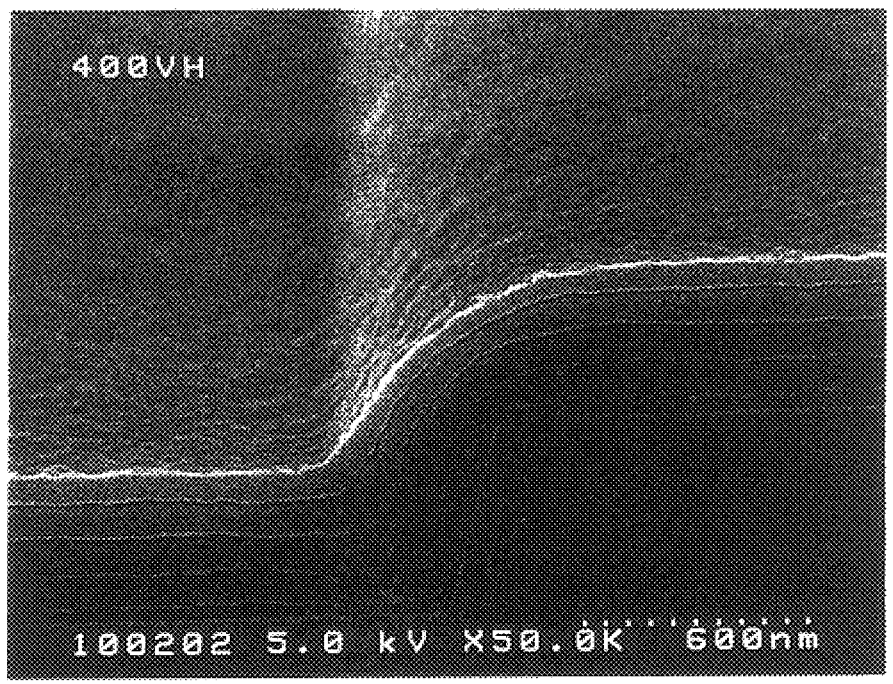
FIG. 2A and FIG. 2B are photographs showing cross-section shapes of a silicon-containing insulating film formed on a substrate with a step and a groove formed by the method of film formation and the method for manufacturing the semiconductor device according to embodiments of the invention.
Figure 2B:
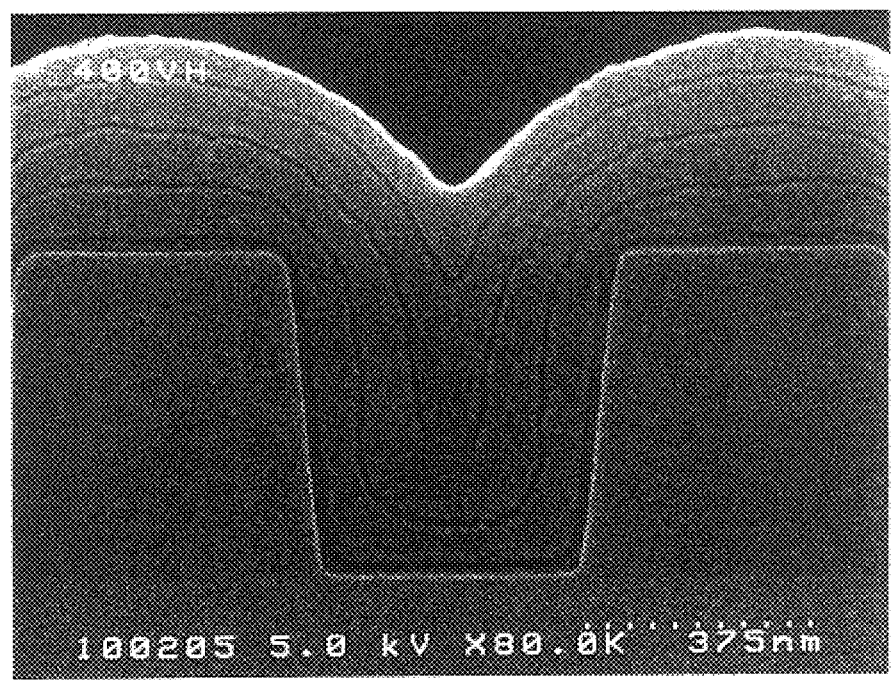

FIG. 2A and FIG. 2B are photographs showing cross-sections of the High $O_3$/TEOS $SiO_2$ film 15 formed in the wide recess 12 and in the narrow recess 13 on the substrate 11. The striped patterns observed in the High $O_3$/TEOS $SiO_2$ film 15 in the photographs are caused by forming a different layer at each deposition of the High $O_3$/TEOS $SiO_2$ film 15 with the predetermined film thickness in order to facilitate observation of how the depositing film forms.

As shown in FIG. 2A, at the recess 12 wide in width, formation of flowing shape is recognized and moreover, as shown in FIG. 2B, at the recess 13 narrow in width, generation of voids and seams in the High $O_3$/TEOS $SiO_2$ film 15 of the recess 13 can be suppressed to embed the High $O_3$/TEOS $SiO_2$ film 15 into the recess 13 without clearance.

As described above, according to the embodiments of the invention, since the surface dependency of the depositing film can be eliminated by covering the surface of the substrate 11 with the phosphosilicate glass film 14, sufficient fluidity can be obtained, even when the High $O_3$/TEOS $SiO_2$ film 15 readily influenced by surface dependency is deposited.

Since the surface dependency of the depositing film can be eliminated sufficiently by the phosphosilicate glass film 14 with a thin film thickness, even the inside of the recess narrow in width can be sufficiently covered.

Therefore, when there is the recess 13 narrow in width on the surface of the substrate 11, the High $O_3$/TEOS $SiO_2$ film 15 can be embedded into the recess 13 without clearance, without voids or seams between the High $O_3$/TEOS $SiO_2$ film 15 and the recess 13.

Furthermore, since the deposition temperature of forming the High $O_3$/TEOS $SiO_2$ film 15 is regulated within the range of 350° C. to 55° C., preferably within the range of 375° C. to 425° C., on the occasion of depositing the High $O_3$/TEOS $SiO_2$ film 15 by the CVD method using the mixed gas of the $O_3$/TEOS, the flowability of the depositing film can be increased.

Moreover, in the embodiments of the invention described above, although the PSG film is used as the base layer 14, the BPSG film may be used as a substitute for the PSG film.

In forming the High $O_3$/TEOS $SiO_2$ film a gas containing a concentration of ozone in oxygen as high as 1% or more and less than 10% is used. However, it can also deposit a Low $O_3$/TEOS $SiO_2$ film not readily influenced by the surface dependency, using, as the ozone containing gas, a concentration of ozone in oxygen as low as less than 1%. In this case, by using the phosphorus-containing insulating film 14 such as the phosphosilicate glass film, in particular, penetration of moisture and migration of alkali ions from the Low $O_3$/TEOS $SiO_2$ film to the substrate can be prevented in addition to elimination of the surface dependency of the depositing film.

Furthermore, in the above description, after depositing the phosphosilicate glass film 14 and before forming the silicon oxide film 15. the surface of the phosphosilicate glass film 14 is converted to hydrophobic by exposing to water vapor. However, the gas discharge means used in forming the phosphosilicate glass film 14 may be replaced with an alternate gas discharge means which is independent from the deposition of phosphorus. Regardless, the substrate 11 may be moved out of the deposition chamber for exposure to the atmosphere. Therefore, the surface dependency in the surface of the phosphosilicate glass film 14 can be eliminated.

Moreover, in the above description, although the phosphosilicate glass film (the phosphor-containing insulating film) 14 is formed within the range of 10 to 100 nm in thickness, it is not limited thereto. Theoretically, it is essential only that the film thickness of the phosphorus-containing insulating film be less than one half of the width of the recess. Accordingly, the upper limit of the film thickness of the phosphorus-containing insulating film would be influenced by the width of the recess.

As described above, in the invention, the surface of the substrate is precoated with the phosphorus-containing insulating film such as the phosphosilicate glass film. Therefore, the surface dependency of the depositing film on the substrate is eliminated to obtain sufficient fluidity during deposition.

Moreover, a gas containing less than 10% ozone in oxygen is used as the ozone-containing gas used in deposition of the silicon-containing insulating film.

That is, the invention is applicable to the High $O_3$/TEOS $SiO_2$ film which is deposited using a high ozone-containing gas such as that having a concentration of ozone in oxygen of 1% or more and which is readily influenced by the surface dependency, or a Low $O_3$/TEOS $SiO_2$ film which is deposited using a low ozone containing gas such as that having a concentration of ozone in oxygen of less than 1% and which is not readily influenced by surface dependency.

In the case of deposition of the High $O_3$/TEOS $SiO_2$ film, it is effective for eliminating the surface dependency, and in the case of deposition of the Low $O_3$/TEOS $SiO_2$ film, it is effective for preventing penetration of moisture and migration of alkali ions from the Low $O_3$/TEOS $SiO_2$ film to the substrate, rather than elimination of the surface dependency.

Moreover, since the surface dependency of the depositing film can be sufficiently eliminated by using the phosphorus-containing insulating film such as the phosphosilicate glass film, even the inside of a recess narrow in width can be sufficiently covered.

Therefore, when there is a recess narrow in width on the surface of the substrate, the silicon oxide film can be embedded in the recess 13 without clearance and without generating voids or seams in the silicon oxide film formed in the recess.

Furthermore, since the deposition temperature in forming the silicon-containing insulating film is regulated within the range of 350° C. to 550° C., preferably within the range of 375° C. to 425° C., on the occasion of depositing the silicon-containing insulating film by the CVD method using the mixed gas of the $O_3$/TEOS, the flowability of the depositing film can be increased.

What is claimed is:

1. A method of film formation comprising: forming a phosphorus-containing insulating film on a substrate; and exposing a surface of said phosphorus-containing insulating film to an atmosphere containing water vapor while heating said surface of said phosphorus-containing insulating film to a temperature of 350 to 550° C. to render the surface of said phosphorus-containing film hydrophobic, to increase film-forming rate of a silicon-containing insulating film subsequently formed by thermal chemical vapor deposition on said surface, and to reduce surface roughness of the subsequently formed insulating film; and then forming the silicon-containing insulating film on said hydrophobic surface of said phosphorus-containing insulating film by thermal chemical vapor deposition using a mixed gas containing a ozone-containing gas and a silicon-containing gas.

2. The method of film formation according to claim 1, wherein a film thickness of said phosphorus-containing insulating film deposited is within the range of 10 nm to 100 nm.

3. The method of film formation according to claim 1, wherein said ozone-containing gas is a gas containing ozone of a concentration of not more than 10% in oxygen.

4. The method of film formation according to claim 1, wherein said silicon-containing gas is a gas containing tetraethylorthosilicate (TEOS).

5. The method of film formation according to claim 1, wherein a deposition temperature during forming said silicon-containing insulating film is within the range of 350° C. to 550° C.

6. The method of film formation according to claim 5, wherein the deposition temperature during forming said silicon-containing insulating film is within the range of 375° C. to 425° C.

7. The method of film formation according to claim 1, wherein said phosphorus-containing insulating film is any one of a phosphosilicate glass film (a PSG film) and a borophosphosilicate glass film.

8. The method of film formation according to claim 7, wherein a phosphorus concentration in said phosphosilicate glass film is not more than 10 mol %.

9. The method of film formation according to claim 1 wherein said temperature is 375° C. to 425° C.

10. A method of film formation comprising:

feeding a first gaseous mixture of an ozone-containing gas, a silicon-containing gas and a phosphorous-containing gas through first piping and discharging the first gaseous into a deposition chamber directly from a first gas discharge means, mounted within the deposition chamber and connected with the first piping, to form a phosphorus-containing insulating film, on a substrate located within the deposition chamber, by a chemical vapor deposition; and after ceasing the discharge of the first gaseous mixture continuously feeding a second gaseous mixture of an ozone-containing gas and a silicon-containing gas through second piping and discharging the second gas mixture into the deposition chamber directly from a second gas discharge means, said second discharge means being separate and different from said first gas discharge means and the second piping being separate and different from the first piping, to form a silicon-containing insulating on said phosphorous-containing insulating film by thermal chemical vapor deposition.

11. The method of film formation according to claim 10, wherein after a step of forming said phosphorus-containing insulating film and before a step of forming the silicon-containing insulating film on said phosphorous-containing insulating film, a surface of said phosphorous-containing insulating film is exposed to an atmosphere containing water vapor while heating the surface of said phosphorous-containing insulating film.

12. The method of film formation according to claim 10, wherein a film thickness of said phosphorus-containing insulating film deposited is within the range of 10 nm to 100 nm.

13. The method of film formation according to claim 10, wherein said ozone-containing gas is a gas containing ozone of a concentration of not more than 10% in oxygen.

14. The method of film formation according to claim 10, wherein said silicon-containing gas is a gas containing tetraethylorthosilicate (TEOS).

15. The method of film formation according to claim 10, wherein a deposition temperature during forming said silicon-containing insulating film is within the range of 350° C. to 550° C.

16. The method of film formation according to claim 15, wherein the deposition temperature during forming said silicon-containing insulating film is within the range of 375° C. to 425° C.

17. The method of film formation according to claim 10, wherein said phosphorus-containing insulating film is any one of a phosphosilicate glass film (a PSG film) and a borophosphosilicate glass film.

18. The method of film formation according to claim 17, wherein a phosphorus concentration in said phosphosilicate glass film is not more than 10 mol %.

19. A method for manufacturing a semiconductor device comprising the steps of:

forming a phosphorus-containing insulating film on a substrate having a recess of a depth exceeding its width;

exposing a surface of said phosphorus-containing insulating film to an atmosphere containing water vapor while heating the surface of said phosphorous-containing insulating film to a temperature of 350 to 550° C.; and then forming a silicon-containing insulating film on said phosphorus-containing insulating film by a thermal chemical vapor deposition using a mixed gas containing a ozone-containing gas and a silicon-containing gas, so that said silicon-containing insulating film becomes embedded in said recess without a clearance.

20. The method for manufacturing a semiconductor device according to claim 19 wherein said exposure of said surface of said phosphorus-containing insulating film converts said surface from hydrophilic to hydrophobic.

21. The method of film formation according to claim 19 wherein said temperature is 375° C. to 425° C.

22. A method of film formation comprising:

feeding a first gaseous mixture of an ozone-containing gas, a silicon-containing gas and a phosphorous-containing gas through first piping and discharging the first gaseous into a deposition chamber directly from a first gas discharge means, mounted within the deposition chamber and connected with the first piping, to form a phosphorus-containing insulating film, on a substrate having a recess and located within the deposition chamber, by a chemical vapor deposition; and after ceasing the discharge of the first gaseous mixture, continuously feeding a second gaseous mixture of an ozone-containing gas and a silicon-containing gas through second piping and discharging the second gas mixture into the deposition chamber directly from a second gas discharge means, said second discharge means being separate and different from said first gas discharge means and the second piping being separate and different from the first piping, to form a silicon-containing insulating on said phosphorous-containing insulating film by thermal chemical vapor deposition, so that said silicon oxide film becomes embedded in said recess without any clearance therebetween.

* * * * *

UNITED STATES PATENT AND TRADEMARK OFFICE
CERTIFICATE OF CORRECTION

PATENT NO. : 6,352,943 B2
DATED : March 5, 2002
INVENTOR(S) : Maeda et al.

It is certified that error appears in the above-identified patent and that said Letters Patent is hereby corrected as shown below:

Title page,
Item [56], References Cited, FOREIGN PATENT DOCUMENTS, insert
-- EP    843,348    5/1998 --.

Column 1,
Line 50, delete "are".

Column 6,
Line 35, "born" should read -- boron --; and
Line 66, last line of Table 1, delete "P-SiO, Al,".

Column 7,
Between lines 4 and 5 under the heading "Type of base layer" insert -- P-SiO,Al, --.

Column 8,
Line 37, delete "is not"; and
Line 54, "ii" should read -- 11 --.

Column 9,
Line 2, "11b" should read -- 111b --;
Line 17, "film" first occurrence should read -- film: --;
Line 55, "55ºC" should read -- 550º C --.

Column 10,
Line 20, "phosphor" should read -- phosphorous --.

Signed and Sealed this

Seventeenth Day of June, 2003

JAMES E. ROGAN
*Director of the United States Patent and Trademark Office*